(12) United States Patent
Sato et al.

(10) Patent No.: US 7,045,394 B2
(45) Date of Patent: May 16, 2006

(54) METHOD OF MANUFACTURING SEMICONDUCTOR DEVICE AND SYSTEM OF MANUFACTURING SEMICONDUCTOR DEVICE

(75) Inventors: Shiro Sato, Tsuruoka (JP); Akiyoshi Aoyagi, Sagamihara (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/973,993

(22) Filed: Oct. 26, 2004

(65) Prior Publication Data

US 2005/0118791 A1    Jun. 2, 2005

(30) Foreign Application Priority Data

Oct. 27, 2003  (JP)  ............... 2003-366082

(51) Int. Cl.
*H01L 21/44* (2006.01)
(52) U.S. Cl. ............... 438/113; 438/114; 438/460; 438/465
(58) Field of Classification Search ............... 438/113, 438/114, 460, 464, 465
See application file for complete search history.

(56) References Cited

U.S. PATENT DOCUMENTS

| | | | |
|---|---|---|---|
| 4,321,672 A | 3/1982 | Braun et al. | |
| 5,023,782 A | 6/1991 | Lutz et al. | |
| 5,044,668 A | 9/1991 | Wright | |
| 5,175,682 A | 12/1992 | Higashiyama et al. | |
| 5,457,305 A | 10/1995 | Akel et al. | |
| 5,824,177 A * | 10/1998 | Yoshihara et al. | 156/250 |
| 5,890,141 A | 3/1999 | Carney et al. | |
| 5,896,298 A | 4/1999 | Richter | |
| 5,897,625 A | 4/1999 | Gustin et al. | |
| 5,936,219 A | 8/1999 | Yoshida et al. | |
| 6,036,344 A | 3/2000 | Goldenberg | |
| 6,038,553 A | 3/2000 | Hyde, Jr. | |
| 6,073,121 A | 6/2000 | Ramzy | |
| 6,164,528 A | 12/2000 | Hills et al. | |
| 6,181,814 B1 | 1/2001 | Carney | |
| 6,464,134 B1 | 10/2002 | Page | |
| 6,808,109 B1 | 10/2004 | Page | |
| 2001/0039534 A1 | 11/2001 | Keene | |
| 2003/0190795 A1 * | 10/2003 | Kawakami | 438/462 |

FOREIGN PATENT DOCUMENTS

| | | |
|---|---|---|
| FR | 2558622 A1 | 7/1985 |
| JP | 11-354556 | 12/1999 |

* cited by examiner

*Primary Examiner*—Hsien-Ming Lee
(74) *Attorney, Agent, or Firm*—Harness, Dickey & Pierce, P.L.C.

(57) ABSTRACT

A method of manufacturing a semiconductor device is provided. A semiconductor module is prepared which has a wiring board and a plurality of semiconductor chips mounted on a first face of the wiring board. The semiconductor chips overlap a central region of the wiring board and an edge region of the wiring board surround the central region. An adhesive tape is located opposite the first face of the wiring board, followed by sticking the adhesive tape to the semiconductor module by a roller. Thereafter, the resulting semiconductor module is cut from a second face side of the wiring board to yield the device. The roller has a central portion and two end portions. The central portion presses the adhesive tape from above the central region. The end portions press the adhesive tape from above the two end regions.

10 Claims, 3 Drawing Sheets

METHOD OF MANUFACTURING SEMICONDUCTOR DEVICE AND SYSTEM OF MANUFACTURING SEMICONDUCTOR DEVICE

RELATED APPLICATIONS

This application claims priority to Japanese Patent Application No. 2003-366082 filed Oct. 27, 2004 which is hereby expressly incorporated by reference herein in its entirety.

BACKGROUND

1. Technical Field

The present invention relates to a method of manufacturing a semiconductor device and a system of manufacturing a semiconductor device.

2. Background Art

There is a known technique to manufacture a semiconductor device by cutting a semiconductor module having a plurality of semiconductor chips. There is also a known technique to cut a wiring board with a semiconductor module adhered to an adhesive tape. In this case, if the region in the semiconductor module having no overlapping semiconductor chip can be stuck to the adhesive tape, the semiconductor module can be prevented from partially scattering (moving) during the cutting process and therefore a semiconductor device with high reliability can be manufactured.

An object of the invention is to provide a method of manufacturing a semiconductor device with high reliability and a system of manufacturing a semiconductor device.

SUMMARY

A method of manufacturing a semiconductor device according to the invention includes the steps of:
preparing a semiconductor module having a wiring board and a plurality of semiconductor chips mounted on a first face of the wiring board, and a central region which the semiconductor chips overlap and edge region surrounding the central region;
making an adhesive tape opposed to the first face of the wiring board and then sticking the adhesive tape to the semiconductor module by a roller; and
thereafter, cutting the resulting semiconductor module from the side of a second face of the wiring board,
wherein the roller has a central portion and two end portions,
the central portion presses the adhesive tape from above the central region, and
the two end portions press the adhesive tape from above the edge region.

According to the invention, the roller has a central portion and two end portions, and presses the adhesive tape through the central portion from above the central region and presses the adhesive tape through the two end portions from above the edge region. Thus, the adhesive tape can be stuck to the edge region of the semiconductor module. In addition, the edge region of the semiconductor module can be prevented from scattering by cutting the semiconductor module with the edge region stuck to the adhesive tape. Therefore, the reliability of the process of manufacturing a semiconductor device can be enhanced. Also, since the central region and the edge region of the semiconductor module can be adhered simultaneously by one roller, the production efficiency of making semiconductor devices can be increased.

In the method of manufacturing a semiconductor device, the two end portions may have a larger diameter than the central portion. This enables the adhesive tape to be stuck to the edge region of the semiconductor module even when the edge region has a thickness that remarkably differs from the central region.

In the method of manufacturing a semiconductor device, the central portion may have an identical diameter to the two end portions.

In the method of manufacturing a semiconductor device, at least the central portion may be composed of an elastic body. This enables the adhesive tape to be stuck to the edge region of the semiconductor module even when the edge region has a thickness that remarkably differs from the central region.

In the method of manufacturing a semiconductor device, the two end portions may be more rigid than the central portion.

A system of manufacturing a semiconductor device according to the invention includes a roller for sticking an adhesive tape to a semiconductor module having a wiring board and a plurality of semiconductor chips mounted on the wiring board, and a central region which the semiconductor chips overlap and edge region surrounding the central region,
the roller including a central portion and two end portions,
the central portion pressing the adhesive tape from above the central region, and
the two end portions pressing the adhesive tape from above the edge region.

According to the invention, the system of manufacturing a semiconductor device includes a roller having a central portion and two end portions. The roller presses the adhesive tape through the central portion from above the central region and presses the adhesive tape through the two end portions from above the edge region. Thus, the adhesive tape can be stuck to the edge region of the semiconductor module. In addition, the edge region of the semiconductor module can be prevented from scattering by cutting the semiconductor module with the edge region stuck to the adhesive tape. Therefore, the reliability of the process of manufacturing a semiconductor device can be enhanced. Also, since the central region and the edge region of the semiconductor module can be simultaneously adhered by one roller, the production efficiency of making semiconductor devices can be increased.

In the system of manufacturing a semiconductor device, the two end portions may have a larger diameter than the central portion. This enables the adhesive tape to be stuck to the edge region of the semiconductor module even when the edge region has a thickness that remarkably differs from the central region.

In the system of manufacturing a semiconductor device, the central portion may have an identical diameter to the two end portions.

In the system of manufacturing a semiconductor device, at least the central portion may be composed of an elastic body.

In the system of manufacturing a semiconductor device, the two end portions may be more rigid than the central portion.

DETAILED DESCRIPTION

Embodiments of the invention will be described below with reference to the drawings. However, the invention is not limited to the following embodiments.

FIGS. 1 to 5 are views to assist explaining a method of manufacturing a semiconductor device according to an embodiment of the invention.

Figure 1:
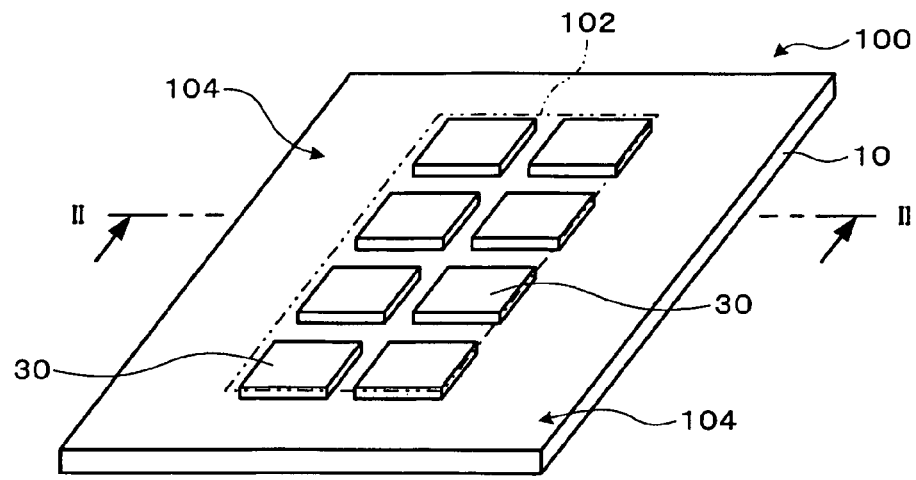
FIG. 1 is a view to assist explaining a method of manufacturing a semiconductor device according to an embodiment of the invention.
Figure 2:
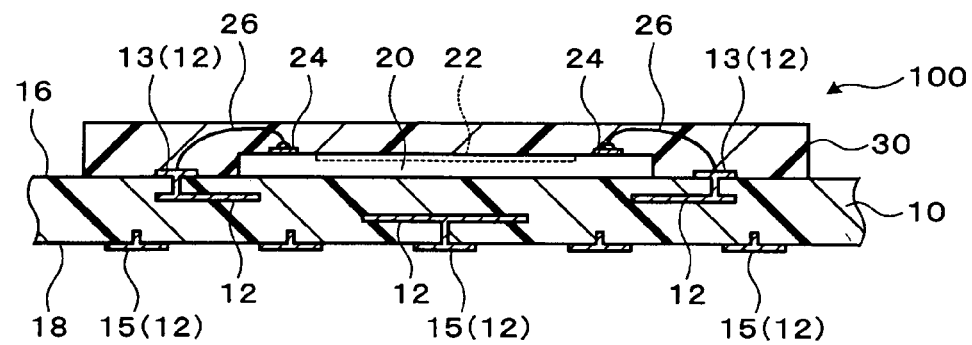
FIG. 2 is a view to assist explaining the method of manufacturing a semiconductor device according to the embodiment of the invention.

The method of manufacturing a semiconductor device according to the embodiment includes preparing a semiconductor module 100 as shown in FIGS. 1 and 2. Here, FIG. 1 is a view showing the semiconductor module 100 and FIG. 2 is a fragmentary enlarged view of a cross section taken along the line II—II in FIG. 1. As shown in FIGS. 1 and 2, the semiconductor module 100 has a wiring board 10. The material for the wiring board 10 is not particularly limited, and the wiring board may be formed from an organic board (e.g., an epoxy board), an inorganic board (e.g., a ceramic board or a glass board), or their composite structures (e.g., a glass-epoxy board). The wiring board 10 may be a rigid board. In this case, the wiring board 10 may serve as an interposer after the cutting process. Alternatively, the wiring board 10 may be a flexible board, such as a polyester board or a polyimide board. Also, the wiring board 10 may be a board for COF (Chip On Film) or for TAB (Tape Automated Bonding). The wiring board 10 may be a single-layer board composed of a single layer, or a laminated board having a plurality of stacked layers. Also, the wiring board 10 is not particularly limited in its shape and thickness.

The semiconductor module 100 has a central region 102 and edge regions 104, as shown in FIG. 1. The central region 102 is a region which a plurality of semiconductor chips 20 (described later) overlap. The edge regions 104 are regions which surround the central region 102, as shown in FIG. 1.

The wiring board 10 has a metallization pattern 12, as shown in FIG. 2. The metallization pattern 12 may be formed by stacking one or more layers of copper (Cu), chromium (Cr), titanium (Ti), nickel (Ni), titanium-tungsten (Ti—W), gold (Au), aluminum (Al), nickel vanadium (NiV), and tungsten (W), or combinations thereof. The metallization pattern 12 may be formed so as to electrically connect one face of the wiring board 10 with the other face thereof. For example, the metallization pattern 12 may have pads 13 and 15, as shown in FIG. 2. On this occasion, the pad 13 is provided on the one face of the wiring board 10, and the pad 15 is provided on the other face of the wiring board 10. The electrical connection between the two faces of the wiring board 10 may be ensured by electrically connecting the pads 13 and 15. In this case, the metallization pattern inclusive of the pads 13 and 15 may be referred to as the metallization pattern 12. When a laminated board is prepared as the wiring board 10, the metallization pattern 12 may be provided between each layer thereof. The method of forming the metallization pattern 12 is not particularly limited. For example, the metallization pattern 12 may be formed by sputtering or the like and an additive process in which the metallization pattern 12 is formed by electroless plating may be applied. The metallization pattern 12 may be produced by plating with solder, tin, gold, nickel, or the like.

The semiconductor module 100 has a plurality of semiconductor chips 20 (see FIG. 2). The semiconductor chips 20 are respectively mounted on the wiring board 10. The face of the wiring board 10 on which the semiconductor chips 20 are mounted may be referred to as a first face 16 (see FIG. 2). That is, it can be said that the semiconductor chips 20 are mounted on the first face 16 of the wiring board 10. In this case, a face of the wiring board 10 opposite the first face 16 may be referred to as a second face 18 (see FIG. 2). The semiconductor chips 20 may be provided on the first face 16 of the wiring board 10 in a matrix form composed of rows and columns. Each of the semiconductor chips 20 may have an integrated circuit 22 composed of a transistor, a memory element, or the like (see FIG. 2). The semiconductor chip 20 may be electrically connected with the metallization pattern 12. For example, the semiconductor chip 20 may have electrodes 24 as shown in FIG. 2, and the electrodes 24 may be electrically connected with the metallization pattern 12. More particularly, as shown in FIG. 2, the semiconductor chip 20 may be mounted on the wiring board 10 as follows: the face opposite the face on which the electrodes 24 are formed (the active face) is opposed to the wiring board 10. In addition, the electrodes 24 may be electrically connected with the metallization pattern 12 (pads 13) using wires 26. In this case, another semiconductor chip may be mounted on the semiconductor chip 20 to form a laminate-type semiconductor device (not shown). However, the form for mounting the semiconductor chip 20 is not limited to this form. The embodiment is not limited to the form where the semiconductor chip 20 is mounted only on the first face 16, and another semiconductor chip may be mounted on the second face 18 (not shown). The region in the semiconductor module 100, which the semiconductor chip 20 overlaps, may be referred to as a central region 102 (see FIG. 1). In this case, areas surrounding (outboard of) the central region 102 in the semiconductor module 100 may be referred to as edge regions 104 (see FIG. 1).

The semiconductor module 100 may have a sealing portion 30. The sealing portion 30 may seal the semiconductor chips 20, wires 26, and the like. The sealing portion 30 can improve the moisture resistance of the semiconductor device and enhance the reliability of the semiconductor device. As shown in FIG. 1, the sealing portion 30 may be formed for each semiconductor chip 20. Alternatively, the sealing portion 30 may be provided so as to seal a plurality of semiconductor chips 20 (not shown). Also, in the case where an additional chip is mounted on the second face 18, the semiconductor module may additionally have another sealing portion (not shown) formed on the second face 18 for sealing the additional chip, otherwise a semiconductor module in a form with no sealing portion may be prepared.

The semiconductor module 100 may be arranged as described above. The method of manufacturing a semiconductor module 100 is not particularly limited, and the semiconductor module may be formed by various techniques. For example, the semiconductor module 100 may be formed by: preparing a wiring board; mounting a semiconductor chip 20 on the wiring board 10; providing wires 26 for electrically connecting the metallization pattern 12 on the wiring board 10 with the electrodes 24 of the semiconductor chip 20; and then forming a sealing portion 30 for sealing the semiconductor chip 20 and the wires 26.

Figure 3:
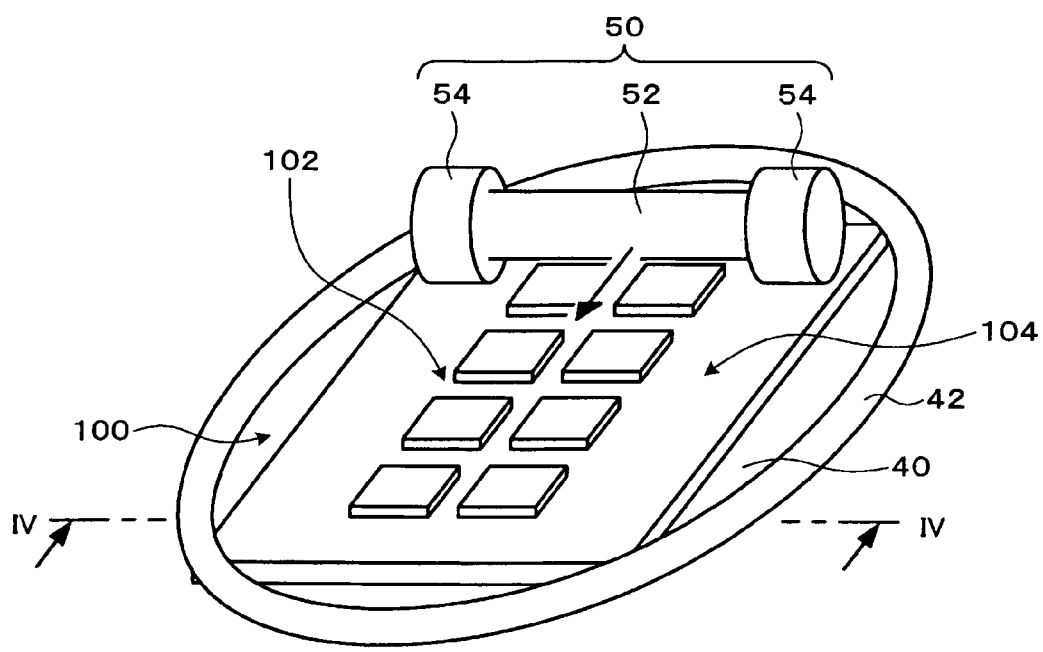
FIG. 3 is a view to assist explaining the method of manufacturing a semiconductor device according to the embodiment of the invention.
Figure 4A:
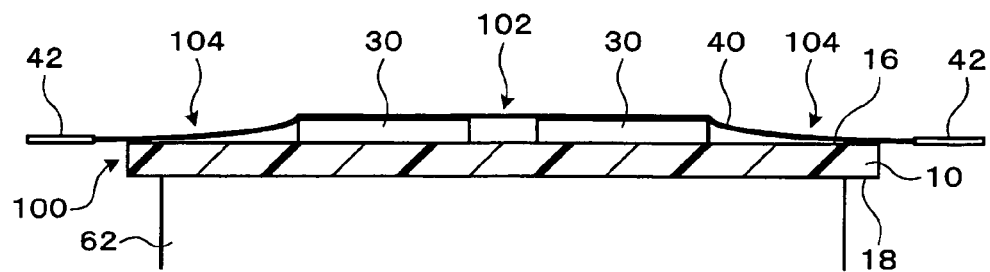
FIGS. 4A and 4B are views to assist explaining the method of manufacturing a semiconductor device according to the embodiment of the invention.
Figure 4B:
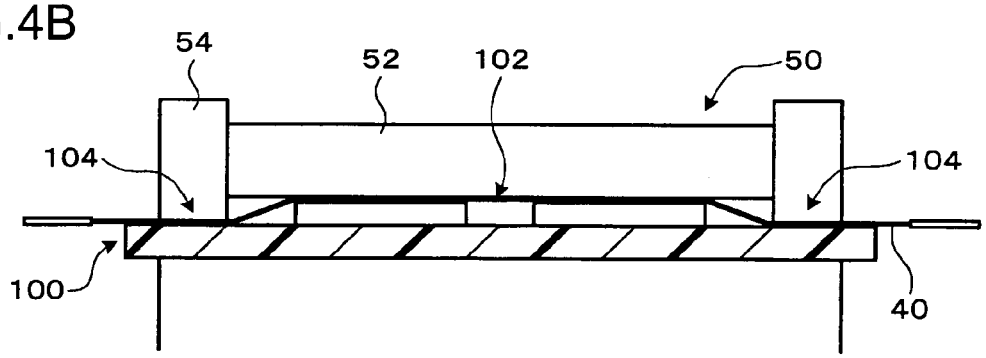

A method of manufacturing a semiconductor device according to the embodiment includes making an adhesive tape 40 opposed to the first face 16 of the wiring board 10 and sticking the adhesive tape 40 to the semiconductor module 100 as shown in FIGS. 3 to 4B. In the method of manufacturing a semiconductor device according to the embodiment, a roller 50 is used to stick the adhesive tape 40 to the semiconductor module 100 (see FIG. 3). That is, the adhesive tape 40 and the semiconductor module 100 are adhered by the roller 50. More specifically, the semiconductor module 100 is set on a supporting base 62 (see FIG. 4A and 4B). In this case, the semiconductor module 100 is set so that the second face 18 of the wiring board 10 is opposed to the supporting base 62. Then, the adhesive tape 40 is positioned opposite the first face 16 of the wiring board 10 (see FIG. 4A). The adhesive tape 40 may be held by a retainer 42, for example. Thereafter, the adhesive tape 40 and the semiconductor module 100 are adhered by the roller 50 including a central portion 52 and two end portions 54 (see FIGS. 3 and 4B). More specifically, the central portion 52 presses the adhesive tape 40 against the central region 102 of the semiconductor module 100 from above, and the two end portions 54 press the adhesive tape 40 against the edge regions 104 of the semiconductor module 100 from above (see FIG. 4B). Thus, the adhesive tape 40 can be stuck to the central region 102 and edge regions 104 of the semiconductor module 100 in one step. As shown in FIGS. 3 and 4B, the diameter of the two end portions 54 of the roller 50 may be larger than that of the central portion 52 of the roller 50. Thus, the following is made possible by using one roller: to press the adhesive tape 40 from above the central region 102 and the edge regions 104. That is, even when the thickness of the central region 102 differs from that of the edge regions 104, the adhesive tape 40 can be stuck to the central region 102 and edge regions 104 of the semiconductor module 100 in one step. Here, FIGS. 4A and 4B are cross-sectional views taken along the line IV—IV in FIG. 3 to assist explaining the sticking step by the roller 50.

Figure 5:
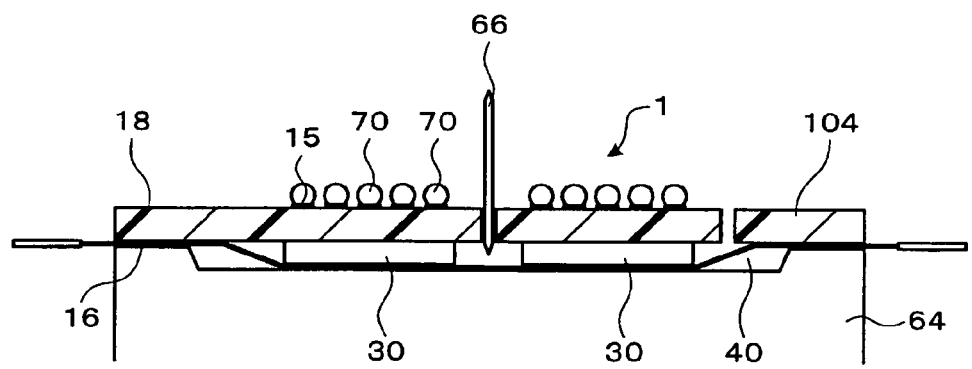
FIG. 5 is a view to assist explaining the method of manufacturing a semiconductor device according to the embodiment of the invention.

The method of manufacturing a semiconductor device according to the embodiment includes cutting the semiconductor module 100 as shown in FIG. 5. The semiconductor module 100 is cut from the side of the second face 18 of the wiring board 10. For example, the semiconductor module 100 (wiring board 10) may be cut by a blade 66 after the semiconductor module 100 has been set on the supporting base 64 as shown in FIG. 5. Incidentally, the step is carried out after the adhesive tape 40 has been stuck to the semiconductor module 100. That is, the semiconductor module 100 is cut in the condition where the adhesive tape 40 is stuck to the semiconductor module 100. As described above, utilizing the roller 50 allows the adhesive tap 40 to be stuck to the central region 102 and edge regions 104 of the semiconductor module 100. Thus, it is possible to hold the edge regions 104 of the semiconductor module 100 on the adhesive tape 40 when the semiconductor module 100 is cut (see FIG. 5). Therefore, the following is made possible: to prevent a part of the semiconductor module 100 from scattering in the step of cutting the semiconductor module 100; and to efficiently manufacture a semiconductor device with high reliability. This step may be carried out after external terminals 70 have been provided on the semiconductor module 100 as shown in FIG. 5. This allows the step of providing the external terminals 70 to be carried out collectively and as such, the production efficiency of making semiconductor devices can be increased. Further, the external terminals 70 may be electrically connected to the metallization pattern 12 and also provided on pads 15 as shown in FIG. 5.

Further, the semiconductor device may be manufactured through the steps of exfoliating the semiconductor module 100 subjected to the cutting process (semiconductor device 1) from the adhesive tape 40, and inspecting and marking the semiconductor device. In the meantime, the above-described steps for manufacturing a semiconductor device may be carried out utilizing a system of manufacturing a semiconductor device, which includes the roller 50. The system of manufacturing a semiconductor device may include supporting bases 62 and 64, and a blade 66. With the system of manufacturing a semiconductor device, a semiconductor device with high reliability can be efficiently manufactured.

Figure 6:
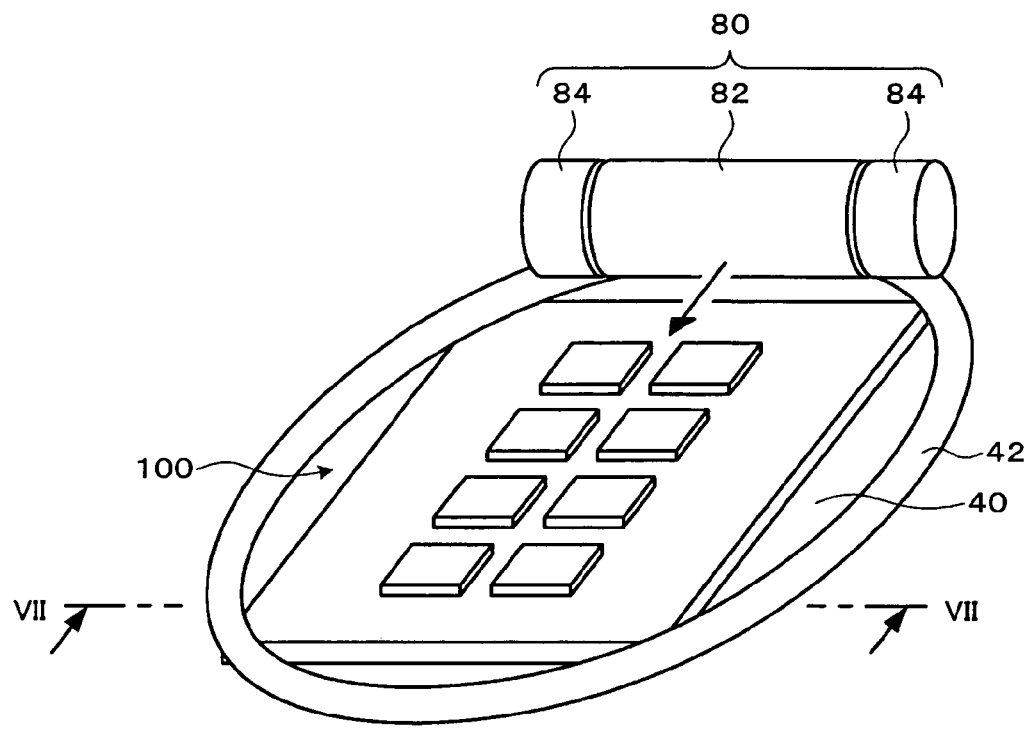
FIG. 6 is a view to assist explaining a method of manufacturing a semiconductor device according to an alternative of the embodiment of the invention.
Figure 7:
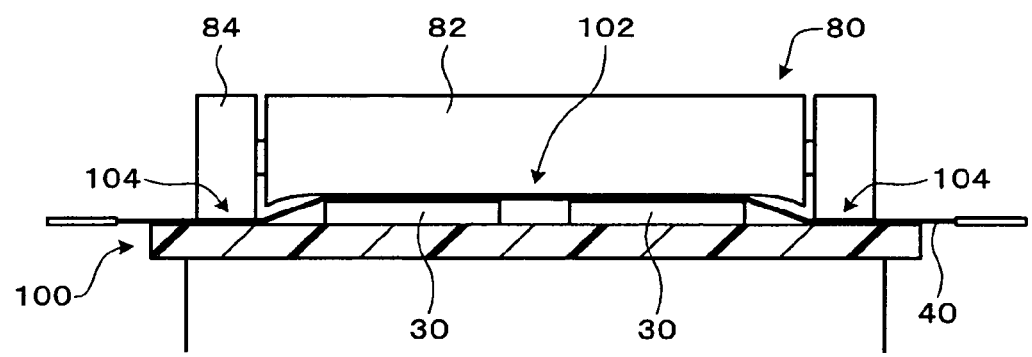
FIG. 7 is a view to assist explaining the method of manufacturing a semiconductor device according to the alternative of the embodiment of the invention.

A method of manufacturing a semiconductor device according to an embodiment of the invention is not limited to the foregoing, and various alternatives are possible. For example, as shown in FIGS. 6 and 7, the adhesive tape 40 may be stuck to the semiconductor module 100 using a roller 80 including a central portion 82 and two end portions 84. In this case, the central portion 82 and the two end portions 84 may be identical in diameter, as shown in FIG. 6. Moreover, at least the center portion 82 may be composed of an elastic or compressible body. In the method of manufacturing a semiconductor device according to the alternative, the central portion 82 can be elastically deformed by pressing the roller 80 against the semiconductor module 100. More specifically, as shown in FIG. 7, the central portion 82 can be elastically deformed by pressing the central portion 82 against the central region 102 of the semiconductor module 100. Therefore, even when the thickness of the central region 102 differs from that of the edge regions 104, the adhesive tape 40 can be pressed against the edge regions 104 of the semiconductor module 100 by the two end portions 84 and thus the tape and the edge regions can be stuck to each other. In this case, the roller 80 may be formed so that the two end portions 84 do not follow the deformation of the central portion 82. For example, as shown in FIG. 7, the central portion 82 and the two end portions 84 may be provided independently of each other. Thus, the following is made possible: to prevent the two end portions 84 of the roller 80 from being deformed; and to press the adhesive tape 40 against the edge regions 104 of the semiconductor module 100. The two end portion 84 of roller 80 may be composed of elastic bodies, and the central portion 82 and the two end portions 84 may be formed from the same material. Alternatively, the two end portions 84 may be more rigid than the central portion 82, by which the same effects can be also achieved. In this case, the central portion and the two end portions may be formed integrally (not shown).

The invention is not limited to the above-described embodiments, and various modifications and changes may be made. For example, the invention may include an arrangement substantially identical to the arrangement described in any one of the embodiments (e.g., an arrangement identical in function, way, and result, or an arrangement identical in objective and effect). Also, the invention may include an arrangement wherein a nonessential part of the arrangement described in any one of the embodiments is replaced with another one. Further, the invention may include an arrangement which can produce the same effect and advantage as the arrangement described in any one of the embodiments can do or an arrangement which can achieve the same object. Still further, the invention may include an arrangement obtained by adding well-known art to the arrangement which has been described in any one of the embodiments.

What is claimed is:

1. A method of manufacturing a semiconductor device comprising the steps of:
   preparing a semiconductor module having a wiring board and a plurality of semiconductor chips mounted on a first face of the wiring board, a central region of the first face being overlapped with the semiconductor chips and an edge region of the first face outboard of the central region;
   locating an adhesive tape opposite the first face of the wiring board and then sticking the adhesive tape to the semiconductor module by a roller; and
   thereafter, cutting the resulting semiconductor module from a second face side of the wiring board,
   wherein the roller has a central portion and two end portions, the central portion pressing the adhesive tape from above the central region, and the two end portions pressing the adhesive tape from above the edge region.

2. The method of manufacturing a semiconductor device of claim 1, wherein the two end portions have a larger diameter than the central portion.

3. The method of manufacturing a semiconductor device of claim 1, wherein the central portion has a substantially identical diameter as the two end portions.

4. The method of manufacturing a semiconductor device of claim 1, wherein at least the central portion comprises an elastic body.

5. The method of manufacturing a semiconductor device of claim 1, wherein the two end portions are more rigid than the central portion.

6. A system of manufacturing a semiconductor device, comprising:
   a roller for sticking an adhesive tape to a semiconductor module having a wiring board and a plurality of semiconductor chips mounted on the wiring board, the semiconductor chips overlapping a central region of the wiring board,
   the roller including a central portion and two end portions,
   the central portion being adapted to press the adhesive tape from above the central region, and
   the two end portions being adapted to press the adhesive tape from above an edge region of the wiring board outboard of the central region.

7. The system of manufacturing a semiconductor device of claim 6, wherein the two end portions have a larger diameter than the central portion.

8. The system of manufacturing a semiconductor device of claim 6, wherein the central portion has a substantially identical diameter as the two end portions.

9. The system of manufacturing a semiconductor device of claim 6, wherein at least the central portion comprises an elastic body.

10. The system of manufacturing a semiconductor device of claim 6, wherein the two end portions are more rigid than the central portion.

* * * * *